US012745409B2

(12) United States Patent
Mazzillo

(10) Patent No.: US 12,745,409 B2
(45) Date of Patent: Sep. 22, 2026

(54) MERGED-PiN SCHOTTKY (MPS) DIODE HAVING NON-UNIFORMLY SPACED WELLS, AND A METHOD FOR MANUFACTURING THE SAME

(71) Applicant: NEXPERIA B.V., Nijmegen (NL)

(72) Inventor: Massimo Cataldo Mazzillo, Nijmegen (NL)

(73) Assignee: Nexperia B.V., Nijmegen (NL)

(*) Notice: Subject to any disclaimer, the term of this patent is extended or adjusted under 35 U.S.C. 154(b) by 400 days.

(21) Appl. No.: 18/467,278

(22) Filed: Sep. 14, 2023

(65) Prior Publication Data

US 2024/0097049 A1 Mar. 21, 2024

(30) Foreign Application Priority Data

Sep. 15, 2022 (EP) .................................... 22195961

(51) Int. Cl.
*H10D 8/60* (2025.01)
*H10D 8/01* (2025.01)
*H10D 62/10* (2025.01)
*H10D 64/62* (2025.01)

(52) U.S. Cl.
CPC ............... *H10D 8/60* (2025.01); *H10D 8/051* (2025.01); *H10D 62/106* (2025.01); *H10D 64/62* (2025.01)

(58) Field of Classification Search
CPC .......... H10D 8/60; H10D 8/051; H10D 64/62; H10D 62/106; H10D 62/10; H10D 62/126; H10D 62/124
See application file for complete search history.

(56) References Cited

U.S. PATENT DOCUMENTS

| | | | | |
|---|---|---|---|---|
| 9,991,399 | B2 * | 6/2018 | Mieczkowski | H10D 8/60 |
| 2009/0179297 | A1 | 7/2009 | Stewart et al. | |
| 2010/0032730 | A1 | 2/2010 | Endo et al. | |
| 2016/0300960 | A1 * | 10/2016 | Miyake | H10D 62/105 |
| 2018/0047855 | A1 * | 2/2018 | Yasui | H10D 8/60 |
| 2022/0028979 | A1 * | 1/2022 | Rascuna | H10D 8/60 |

FOREIGN PATENT DOCUMENTS

| | | | | |
|---|---|---|---|---|
| JP | 2010003841 A * | 1/2010 | | H10D 8/60 |
| JP | 6632910 B2 | 1/2020 | | |
| WO | 2016/002057 A1 | 1/2016 | | |
| WO | 2022/011983 A1 | 1/2022 | | |

* cited by examiner

*Primary Examiner* — Wael M Fahmy
*Assistant Examiner* — Tiberiu Dan Onuta
(74) *Attorney, Agent, or Firm* — Ruggiero McAllister & McMahon LLC

(57) ABSTRACT

Aspects of the present disclosure generally relate to an MPS diode and a manufacturing method therefor. The MPS diode includes a semiconductor body including an active area, the active area includes a drift region of a first conductivity type, and a plurality of wells of a second conductivity type different from the first conductivity type, the plurality of wells being mutually spaced apart, each well forming a respective PN-junction with the drift region. The MPS diode further includes a metal layer assembly arranged on a surface of the semiconductor body and at least one metal layer, the metal layer assembly forming a plurality of Schottky contacts together with the drift region and a plurality of respective Ohmic contacts with the plurality of wells. A spacing between adjacently arranged wells increases in an outward direction from a center of the active area.

18 Claims, 4 Drawing Sheets

MERGED-PiN SCHOTTKY (MPS) DIODE HAVING NON-UNIFORMLY SPACED WELLS, AND A METHOD FOR MANUFACTURING THE SAME

CROSS-REFERENCE TO RELATED APPLICATIONS

This application claims the benefit under 35 U.S.C. § 119(a) of European Application No. 22195961.2 filed Sep. 15, 2022, the contents of which are incorporated by reference herein in their entirety.

BACKGROUND

1. Field of the Disclosure

Aspects of the present disclosure generally relate to an MPS diode and a method for manufacturing such an MPS diode.

2. Description of the Related Art

A cross-sectional view of a Merged-PiN Schottky (MPS) diode 100 known in the art is shown in FIG. 1. MPS diode 100 comprises a substrate 101 and an epitaxial layer 102 arranged on said substrate 101, which together form a semiconductor body. Epitaxial layer 102 comprises a drift region 103 and a plurality of wells 104. Drift region 103 is of a first conductivity type, i.e., drift region 103 has one of an n-type doping and p-type doping. Wells 104 are of a second conductivity type different from the first conductivity type, i.e., an opposite conductivity type to drift region 103.

MPS diode 100 further comprises a metal layer assembly arranged on the semiconductor body. In this example, the metal layer assembly comprises a first metal layer 105*a* that is brought into contact with drift region 103 and wells 104. First metal layer 105*a* forms a plurality of Schottky contacts with drift region 103, and a plurality of Ohmic contacts with wells 104. Metal layer assembly may include a second metal layer 105*b* which is arranged on first metal layer 105*a* and may form a first terminal of MPS diode 100 that provides external electrical access thereto. Furthermore, a contact 106 is arranged on substrate 101 and may form a second terminal of MPS diode 100 that provides external electrical access thereto.

Wells 104 and drift region 103 are included in an active area of the semiconductor body. A termination area 108 may be provided adjacent to the active area that can accommodate a high electric field to prevent premature breakdown from occurring along an edge or periphery of the active area. The metal layer assembly may be electrically insulated from the termination area, for example by an insulating layer 107 such as an oxide layer. Further layers not shown in FIG. 1 may be arranged, such as passivation layers, as appreciated by the skilled person.

Wells 104 form respective PN junctions with drift region 103. Depending on a forward voltage applied to the first and second terminal, MPS diode 100 may be operable in several modes. At lower voltages, MPS diode 100 may operate in a first mode, a depletion region of said PN junctions extends between adjacent wells, thereby preventing or substantially limiting a Schottky current from flowing from first metal layer 105*a* towards substrate 101. At higher voltages, MPS diode 100 may operate in a second mode, in which the depletion region of said PN junctions becomes smaller, thereby enabling a Schottky current to flow from first metal layer 105*a* towards substrate 101.

Other examples of MPS diodes are known from WO2022/011983A1, US2010/032730A1, JP2010/003841A, US2009/179297A1, WO2016/002057A1 and JP6632910B2.

Key parameters of MPS diodes include an on-state voltage drop VF and forward surge current capability IFSM. These two parameters are particularly relevant for the power dissipation and power handling capability of the MPS diode. There is a need for MPS diodes having a relatively low on-state voltage drop VF and improved forward surge current capability IFSM.

SUMMARY

Aspects of the present disclosure relate to an MPS diode in which the abovementioned drawback(s) do not occur, or hardly so.

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

According to an aspect of the present disclosure, an MPS diode is provided. The MPS diode comprises a semiconductor body including an active area, wherein the active area comprises a drift region of a first conductivity type, and a plurality of wells of a second conductivity type different from the first conductivity type, the plurality of wells being mutually spaced apart, each well forming a respective PN-junction with the drift region. The MPS diode further comprises a metal layer assembly arranged on a surface of the semiconductor body and comprising at least one metal layer, the metal layer assembly forming a plurality of Schottky contacts together with the drift region and a plurality of respective Ohmic contacts with the plurality of wells. A spacing between adjacently arranged wells increases in an outward direction from a center of the active area.

The Applicant has found that a current density closer to the edge of the active area is lower typically lower than in a center of the active area in known MPS diodes. This effect can negatively impact the on-state voltage VF and/or the forward surge current capability IFSM due to a smaller portion of the active area participating to the current conduction of the MPS diode. Moreover, in some regions of the device can be prematurely subjected to conduction of high current density resulting in local heating effects which can be detrimental for long-term operation of the MPS diode.

In particular, it was found that a voltage drop across the PN junctions is higher in the center of the active area due to a contribution of current generated near the edge of the active area. Said current not only flows downwards towards the substrate, but also flows partially laterally towards the center of the active area. As a result, a higher voltage drop is generated along a longer path, causing PN junctions near the edge of the active area to have a lower voltage drop than PN junctions near the center of the active area. This, in turn, causes the space between adjacent wells near the edge of the active area to be relatively more depleted, thus limiting the Schottky current more at the edge of the active area.

In the MPS diode in accordance with the present disclosure, a spacing between adjacent wells is provided such that it increases from the center of the active area to the edge of the active area. In other words, a spacing between adjacent wells near the edge of the active area is larger than a spacing between adjacent wells near the center of the active area. In doing so, despite the lower voltage drop across the PN junctions near the edge of the active area, a similar Schottky current can flow between adjacent wells near the edge compared to adjacent wells near the center, thereby improving the current uniformity, which can in turn improve the on-state voltage $V_F$ and the surge forward current capability IFSM of the MPS diode.

The drift region comprises a doped region surrounding the plurality of wells and having a dopant concentration that is greater than that in a remainder of the drift region. In addition, a dopant profile of the doped region is such that, for wells of each pair of adjacently arranged wells, the doped region between said wells becomes depleted at substantially a same voltage applied to the MPS diode.

The plurality of wells may be arranged as concentric shapes, such as elliptical or polygonal shapes. In that case, a spacing between each pair of adjacently arranged wells may be substantially constant along a circumference thereof.

Alternatively, the plurality of wells may be formed as strips extending in a first direction parallel to the surface of the semiconductor body. In that case, the spacing between adjacently arranged strips may be constant along the first direction.

In yet another alternative, the plurality of wells may be formed as strips extending parallel to the surface of the semiconductor body, and the strips may fan out with respect to one another in at least part of the active area. For example, the active area may comprise an inner region in which a spacing between adjacently arranged strips is substantially constant, and a fanout region surrounding the inner region in which a spacing between adjacently arranged strips increases in the outward direction. In a further embodiment, the active area may further comprise an outer region surrounding the fanout region in which a spacing between adjacently arranged strips is substantially constant, and the spacing between adjacently arranged strips in the outer region may be greater than the spacing between adjacently arranged strips in the inner region.

The spacing between adjacently arranged wells at or near an edge of the active area may be at least 50% greater than the spacing between adjacently arranged wells at or near the center of the active area, preferably at least 100% greater. For example, the spacing between adjacent wells in the outer region may be two times greater than the spacing between adjacent wells in the inner region.

The spacing between adjacently arranged wells at or near the center of the active area may be in a range between 1-5 μm, such as 2 μm, and the spacing between adjacently arranged wells at or near the edge of the active area may be in a range between 2-10 μm, such as 4 μm.

The dopant concentration in the doped region may be at least two times greater than the dopant concentration in a remainder of the drift region.

The dopant concentration in the doped region may decrease from the center of the active area to the edge of the active area, in accordance with a spacing between adjacently arranged wells. In particular, for wells of a pair of wells having a larger spacing, the dopant concentration of the doped region in between said wells may be lower, whereas for wells of a pair of wells having a smaller spacing, the dopant concentration of the doped region in between said wells may be higher.

For example, the doped region in between the wells of each pair of adjacently arranged wells may have a dopant concentration that decreases from the center of the doped region to the edge of the doped region, in accordance with the spacing of said wells.

The MPS diode may typically be used as a rectifier. In that case, for example, the MPS diode may need to conduct a relatively high current in its forward mode of operation and should block or substantially limit current from flowing in reverse bias. In reverse conditions, current leakage may occur if some of the pairs of wells are not substantially pinched off. Hence, by employing the above method, a leakage current in reverse bias operation can be limited.

The doped region and the plurality of wells may each extend from the surface of the semiconductor body, and the doped region may extend further into the semiconductor body than the plurality of wells, preferably at least 10% further, more preferably at least 20% further.

The semiconductor body may further comprise a termination area arranged adjacent to the active area.

The semiconductor body may comprise a substrate and an epitaxial layer arranged on said substrate. The active area and, if applicable, the termination area may be arranged in the epitaxial layer.

The metal layer assembly may form a first terminal of the MPS diode, and the MPS diode may further comprise a contact arranged on the substrate, said contact forming a second terminal of the MPS diode.

Each of the plurality of wells may further comprise a subregion having a higher dopant concentration than a remainder of said well for enabling an Ohmic contact with the metal layer assembly.

According to another aspect of the present disclosure, a method for manufacturing an MPS diode is provided. The method comprises providing a semiconductor body comprising a drift region of a first conductivity type, forming a plurality of wells of a second conductivity type different from the first conductivity type in the doped region, the plurality of wells being mutually spaced apart, each well forming a respective PN-junction with the drift region, wherein, in an outward direction from a center of the active area, a spacing between adjacently arranged wells increases, and arranging a metal layer assembly on a surface of the semiconductor body, said metal layer assembly comprising at least one metal layer, wherein said metal layer assembly forms a plurality of Schottky contacts together with the drift region and a plurality of respective Ohmic contacts with the plurality of wells.

BRIEF DESCRIPTION OF DRAWINGS

Next, the present disclosure will be described in more detail with reference to the appended drawings, wherein.

Figure 1:
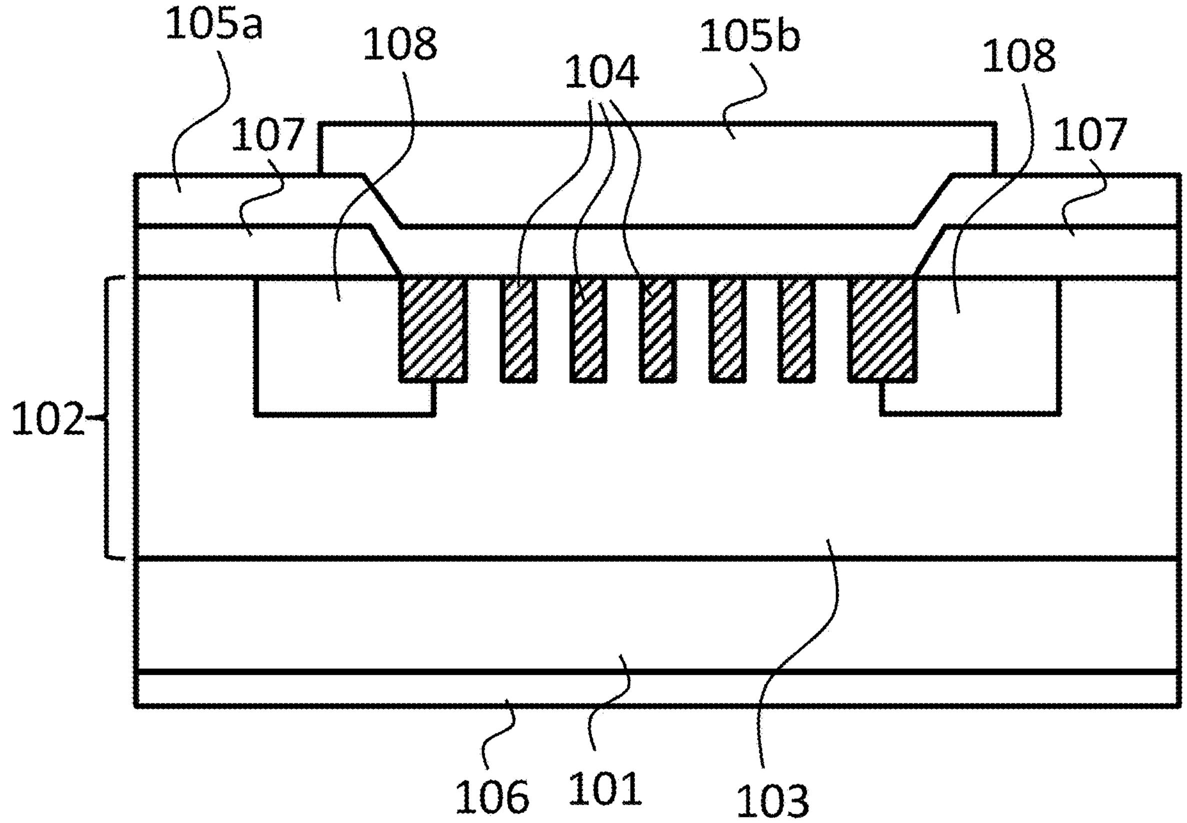
FIG. 1 is a cross-sectional view of a known MPS diode.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the detailed description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the detailed description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms.

Figure 2:
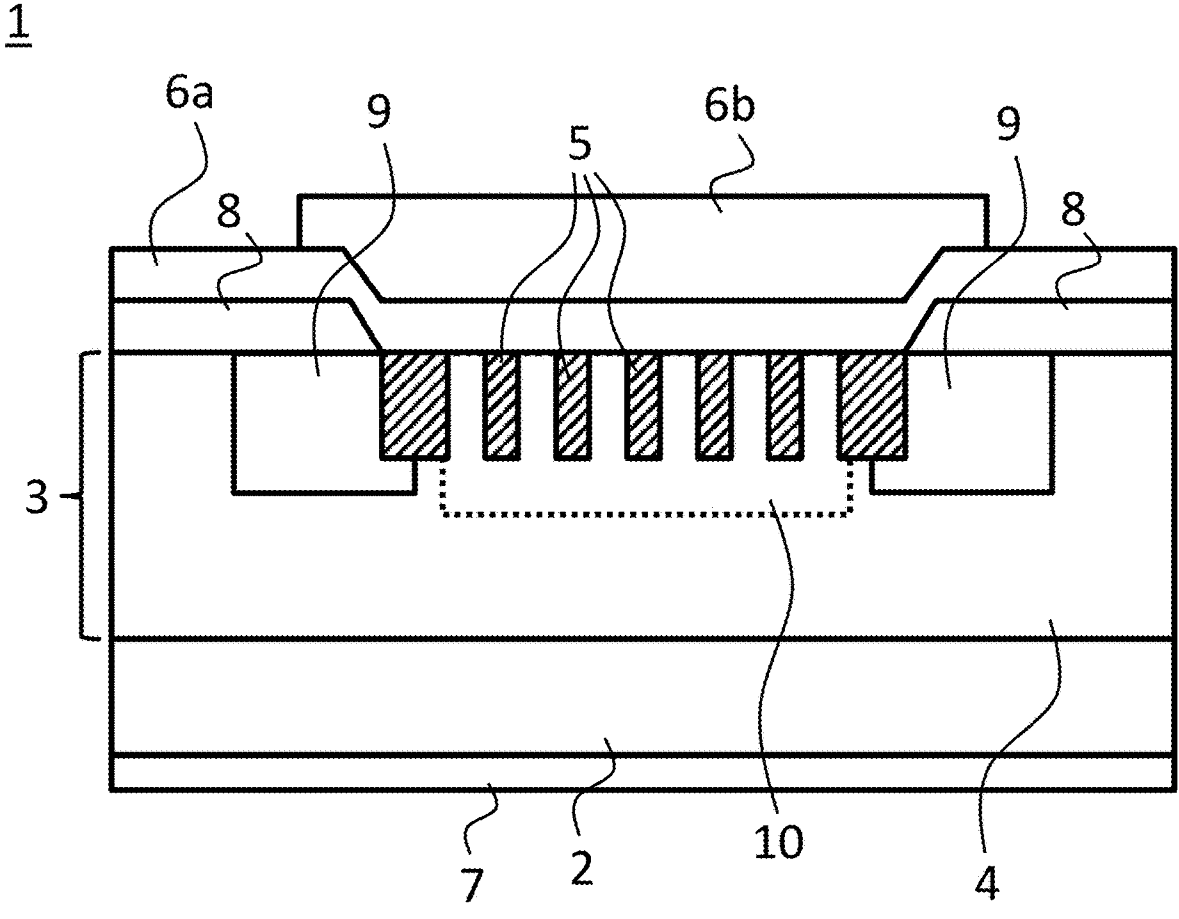
FIG. 2 is a cross-sectional view of an MPS diode in accordance with an embodiment of the present disclosure.

In FIG. 2, a cross-sectional view of an MPS diode 1 is shown in accordance with an embodiment of the present disclosure. MPS diode 1 comprises a substrate 2 having an epitaxial layer 3 formed (e.g., grown) thereon which are included in the semiconductor body of MPS diode 1. Epitaxial layer includes a drift region 4 of a first conductivity type and a plurality of wells 5 of a second conductivity type which form part of an active area of MPS diode 1. Substrate 2 may have a same conductivity type as drift region 4 and typically has a substantially greater dopant concentration than drift region 4. Within the context of the present disclosure, the first conductivity type may correspond to one of an n-type and p-type doping, whereas the second conductivity type may correspond to another of an n-type and p-type doping.

Although not shown in FIG. 2, the semiconductor body may further comprise a buffer layer in between substrate 2 and epitaxial layer 3, and typically having a dopant concentration in between that of substrate 2 and epitaxial layer 3.

A metal layer assembly is arranged on top of the semiconductor body, comprising a first metal layer 6*a* and, optionally, a second metal layer 6*b*. Furthermore, a contact 7 is arranged at a surface of substrate 2 opposite to epitaxial layer 3. The metal layer assembly and contact 7 may form respective terminals of MPS diode 1 that enable external electrical access to the semiconductor body.

First metal layer 6*a* is arranged to contact the drift region and the plurality of wells. In particular, first metal layer 6*a* forms a plurality of Ohmic contacts with wells 5, and a plurality of Schottky contacts with drift region 4 in between wells 5. To that end, first metal layer 6*a* may be made of a material or composite material that is suitable for forming said Schottky contacts and Ohmic contacts. Examples of such materials or composites include titanium or titanium nitride for forming the Schottky contacts and nickel silicide for forming the Ohmic contacts, though the present disclosure is not limited thereto.

In some embodiments, a subregion (not shown) can be formed inside wells 5 at the surface of the semiconductor body for the purpose of improving the Ohmic contact with the metal layer assembly. For example, the subregion may comprise a highly doped region having a higher dopant concentration than a remainder of the well 5. A typical dopant concentration for wells 5 may for example be 1e18 $cm^{-3}$, and a dopant concentration of the subregion may be 1e19 $cm^{-3}$ or even 1e20 $cm^{-3}$.

Second metal layer 6*b* is a top layer of the metal layer assembly in the embodiment shown in FIG. 2 and may thus form an outside contact of MPS diode 1 for external electrical access to first metal layer 6*a*. Second metal layer 6*b* may for example be made of aluminum, copper, alloys thereof, or the like, though the present disclosure is not limited thereto. Although two metal layers are shown in FIG. 2, the present disclosure also envisages only having first metal layer 6*a*, or more than two metal layers which may be composed of the same or different materials with respect to first metal layer 6*a* and second metal layer 6*b*.

Contact 7 may form another outside contact of MPS diode 1, and may for example be made of titanium, nickel, silver, alloys thereof, or the like. Although one layer is shown in FIG. 2, in some embodiments, contact 7 may comprise a plurality of layers, i.e., a metal layer stack. For example, contact 7 may comprise a first layer in contact with substrate 2 comprising a nickel silicon alloy, and a second layer in contact with the first layer that comprises titanium, nickel, silver, alloys thereof, or the like.

In drift region 4, a doped region 10 may be provided surrounding each of the plurality of wells 5 and may have a dopant concentration that is greater than that of a remainder of drift region 10. Doped region 10 extends from a same surface of the semiconductor body as wells 5 and may for example extend at least 10% further into the semiconductor body than wells 5. Furthermore, doped region 10 is of the first conductivity type and may thus form a PN junction with each of the plurality of wells 5.

A relative spacing between adjacently arranged wells 5 in FIG. 2 is further detailed with reference to FIGS. 3-5.

Figure 3:
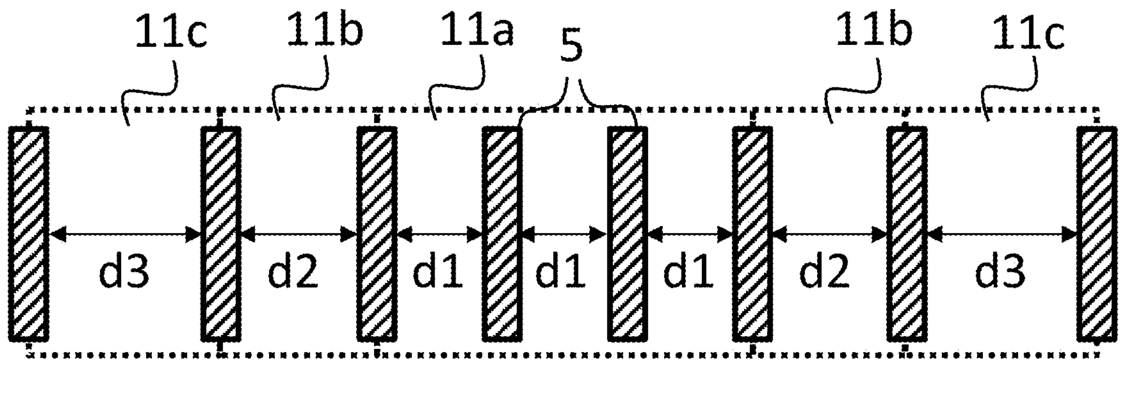
FIGS. 3, 4 and 5 are simplified top views illustrating configurations of the wells and the doped region in accordance with various embodiments of the present disclosure.

In FIG. 3, a simplified partial top view of FIG. 2 in accordance with an embodiment of the present disclosure is shown. In particular, for convenience, only wells 5 are shown. In this embodiment, wells 5 are formed as parallel strips in the semiconductor body. Only eight wells 5 are shown in FIG. 3 for illustrative purposes. However, MPS diode 1 may include more than eight wells, for example more than 100 wells or even more than 1.000 wells.

In the embodiment shown in FIG. 3, a spacing between adjacent wells is increased from a center of the active area to an edge of the active area. In particular, a first group 11*a* is shown to have a first spacing d1, a second group 11*b* adjacent the first group 11*a* is shown to have a second spacing d2, and a third group 11*c* adjacent the second group 11*b* is shown to have a third spacing d3. In accordance with the present disclosure, third spacing d3 may be greater than second spacing d2 and second spacing d2 may be greater than first spacing d1. Although FIG. 3 illustrates three groups 11*a*-1*c*, the present disclosure also envisages having only two groups or having more than three groups. In accordance with the present disclosure, the spacing between adjacent wells 5 near the edge of the active area is greater than the spacing near the center of the active area. Furthermore, each group may include any number of wells 5, though preferably first group 11*a* (i.e., a center portion) may include between 40-60% of the total number of wells 5, for example about 50%.

Figure 4:
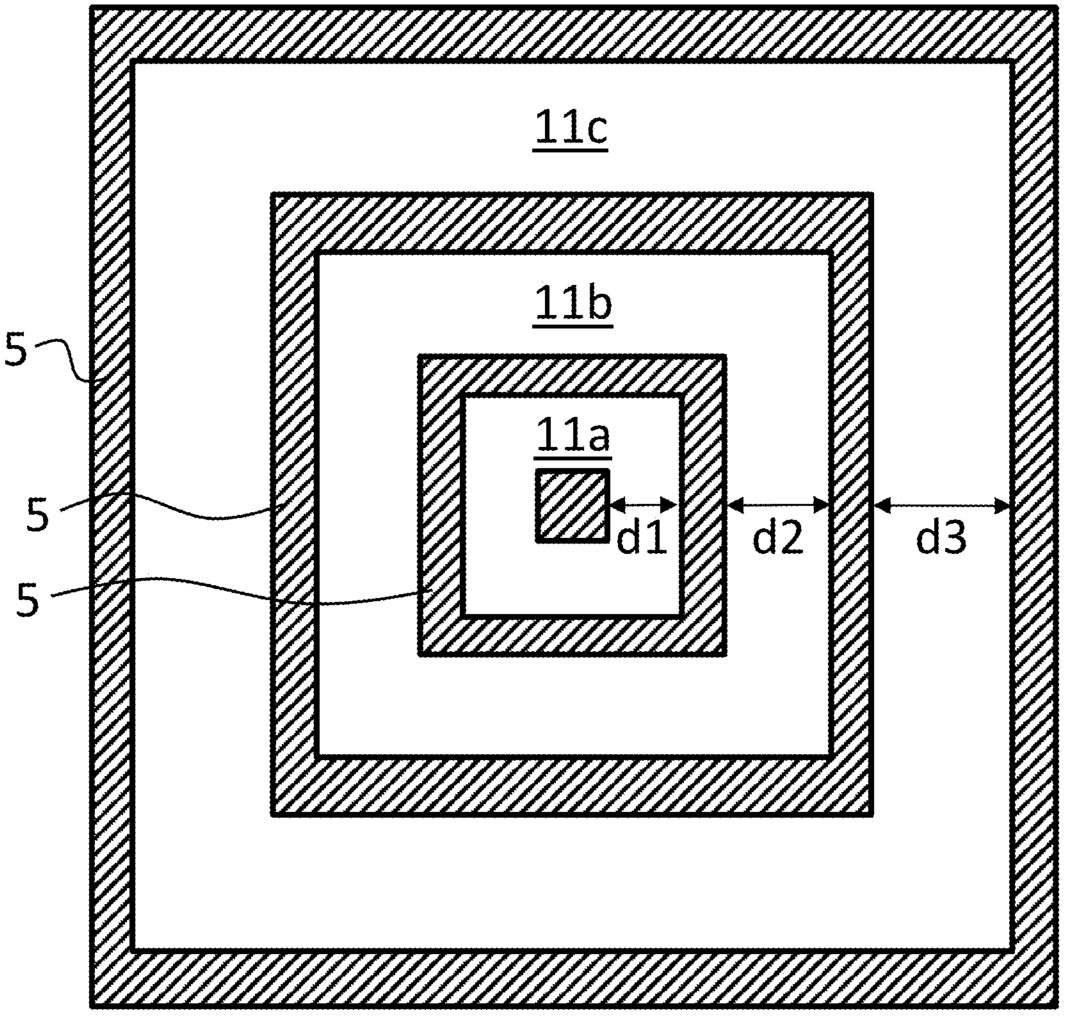
Figure 5:
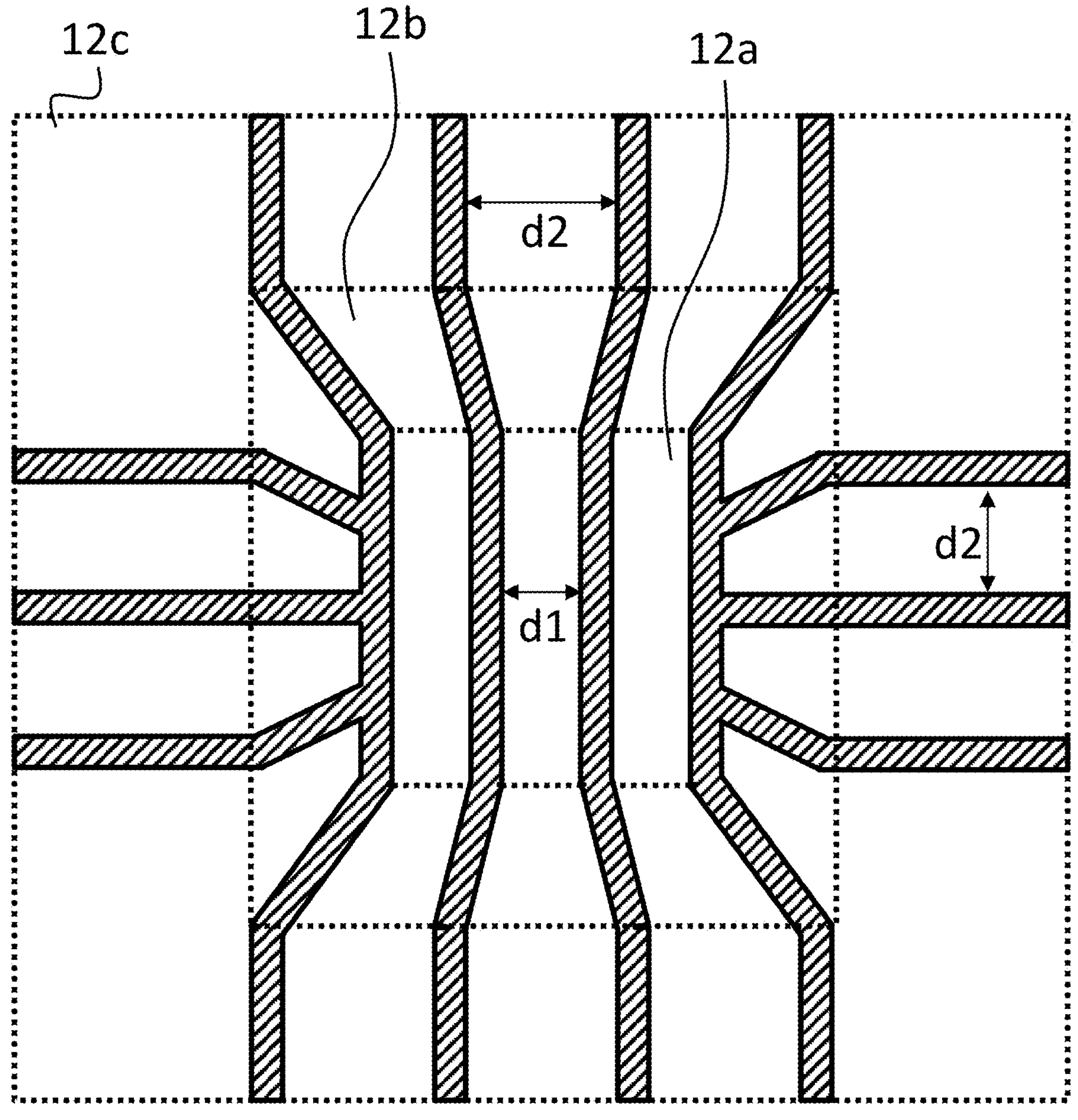

In FIG. 4 and FIG. 5, simplified partial top views of MPS diode 1 of FIG. 2 in accordance with embodiments of the present disclosure are shown. Again, for convenience, only wells 5 are shown.

As shown in FIG. 4, wells 5 may be formed as concentric shapes. For example, rectangular shapes such as those shown in FIG. 4 can be employed. However, any concentric shape, such as any other polygonal shape or an elliptical (e.g., circular) shape may be used. The spacing between adjacent wells 5 along a circumference of said wells may be substantially constant.

Similarly to FIG. 3, in the embodiment shown in FIG. 4, a plurality of groups 11*a*-11*c* (e.g., two or more groups) may be formed in which wells 5 of each pair of adjacently arranged wells have a corresponding spacing. Therefore, although FIG. 4 illustrates a single pair of wells 5 having first spacing d1, second spacing d2 and third spacing d3, there may be a plurality of wells 5 with such a spacing.

Although in FIGS. 3 and 4 the spacing between a same pair of adjacently arranged wells 5 remains substantially constant along a direction in which they extend, this does not need to be the case. For example, as shown in FIG. 5, wells 5 may be formed as strips, and the active area may include an inner region 12*a* in which the strips have first spacing d1 and a fanout region 12*b* in which the strips have a variable, increasing spacing. Optionally, the active area may further include an outer region 12*c* in which the strips have second spacing d2 that is greater than first spacing d1. In fanout region 12*b*, the spacing may increase from first spacing d1 to second spacing d2 in an outward direction.

Referring again to FIG. 2, drift region 4 may include a doped region 10 having a higher dopant concentration than a remainder of drift region 4. In some embodiments, doped region 10 may have a lateral dopant profile in which a dopant concentration decreases from a center of the active area to an edge of the active area in accordance with a spacing between adjacent wells in said doped region 10. In particular, the dopant profile of doped region 10 may be such that, for wells of each pair of adjacently arranged wells 5, doped region 10 between said wells becomes depleted at substantially a same voltage applied to the MPS diode.

In particular, when the spacing between wells 5 is greater, the extent to which the depletion region of PN junctions needs to extend to pinch off the corresponding portion of the drift region between said adjacent wells 5 is greater. To that end, a dopant concentration in between wells 5 having a larger spacing may be lower than a dopant concentration in between wells 5 having a smaller spacing. For example, in FIG. 3, the dopant concentration of doped region 10 in between wells having third spacing d3 may be lower than the dopant concentration of doped region 10 in between wells having first spacing d1 or second spacing d2. This may be similarly applied to the embodiments in FIG. 4 and FIG. 5.

In an example, drift region 4 may have a dopant concentration of about 1e16 $cm^{-3}$, whereas doped region 7 may have a dopant concentration ranging from 1e16-1e17 $cm^{-3}$, depending on the dopant profile. The dopant profile may be formed to be continuous or may include one or more steps, in accordance with a change in spacing between wells 5 from the center of the active area to the edge.

MPS diode 1 may further include a termination area adjacent to the active area and in which a termination region 9 of the second conductivity type is arranged. The termination area may be configured to accommodate a relatively high electric field to prevent or limit breakdown from occurring in MPS diode 1 along an edge of the active area. Termination region 9 may be electrically insulated from the metal layer assembly by an insulating layer 8 such as an oxide layer. Doped region 10 may be spaced apart from the termination area, and in particular from termination region 9, though it may also extend across a full area of the active area. Termination region 9 may be formed to have a closed-loop shape surrounding the active region in the semiconductor body. Termination region 9 may for example have a dopant concentration in a range between 1e17 $cm^{-3}$-1e18 $cm^{-3}$.

Although the termination area in FIG. 2 is shown to include termination region 9, a plurality of termination regions may be used. Various types of termination structures may be used in the termination area instead of the structure shown in FIG. 2, as would be appreciated by the skilled person. For example, instead of a single zone junction termination extension (JTE), a double zone JTE may be used, guard rings at a floating potential, or the like. The present disclosure is not limited to any particular type of termination structure in the termination area.

A manufacturing method for MPS diode 1 may be as follows. First, a semiconductor body is provided, for example substrate 2 on which epitaxial layer 3 is grown. Epitaxial layer 3 may comprise or define drift region 4 of the first conductivity type. Doped region 10 may be implanted in the semiconductor body, in particular epitaxial layer 3, using one or more mask layers as described above, the mask layer being patterned to form a desired shape and position of doped region 10. After the implantation step(s), said mask layer can be removed again. Wells 5 may be provided via another implantation step using another patterned mask layer defining a desired shape and position of wells 5, and the another patterned mask layer may be removed again after the another implantation step. After that, the metal layer assembly can be arranged on top of the semiconductor body. Contact 7 may be provided with the semiconductor body or arranged subsequently to any of the above described steps. The method may also include, prior to arranging the metal layer assembly, forming termination region 9 via an yet another implantation step using yet another patterned mask layer defining a desired shape and position of termination region 9, as well as arranging insulating layer 8 on top of part of the semiconductor body for electrically insulating the metal layer assembly from the termination area.

Further steps may be included, such as providing a buffer layer between substrate 2 and epitaxial layer 3, providing passivation layers covering part of the metal layer assembly, or the like, as will be appreciated by the skilled person.

The present disclosure includes the following clauses, corresponding to the claims of the parent application as originally filed:

Clause 1. A merged PiN Schottky, 'MPS', diode, comprising: a semiconductor body including an active area, wherein the active area comprises: a drift region of a first conductivity type; and a plurality of wells of a second conductivity type different from the first conductivity type, the plurality of wells being mutually spaced apart, each well forming a respective PN-junction with the drift region; and a metal layer assembly arranged on a surface of the semiconductor body and comprising at least one metal layer, the metal layer assembly forming a plurality of Schottky contacts together with the drift region and a plurality of respective Ohmic contacts with the plurality of wells, wherein, in an outward direction from a center of the active area, a spacing between adjacently arranged wells increases.

Clause 2. The MPS diode according to clause 1, wherein the plurality of wells are arranged as concentric shapes, such as elliptical or polygonal shapes, and wherein a spacing between each pair of adjacently arranged wells is substantially constant along a circumference thereof.

Clause 3. The MPS diode according to clause 1, wherein the plurality of wells are formed as strips extending in a first direction parallel to the surface of the semiconductor body, and wherein the spacing between adjacently arranged strips is constant along the first direction.

Clause 4. The MPS diode according to clause 1, wherein the plurality of wells are formed as strips extending parallel to the surface of the semiconductor body, and wherein the strips fan out in at least part of the active area.

Clause 5. The MPS diode according to clause 4, wherein the active area comprises an inner region in which a spacing between adjacently arranged strips is substantially constant, and a fanout region surrounding the inner region in which a spacing between adjacently arranged strips increases in the outward direction.

Clause 6. The MPS diode according to clause 5, wherein the active area further comprises an outer region surrounding the fanout region in which a spacing between adjacently arranged strips is substantially constant, wherein the spacing between adjacently arranged strips in the outer region is greater than the spacing between adjacently arranged strips in the inner region.

Clause 7. The MPS diode according to any of the previous clauses, wherein the spacing between adjacently arranged wells at or near an edge of the active area is at least 50% greater than the spacing between adjacently arranged wells at or near the center of the active area, preferably at least 100% greater.

Clause 8. The MPS diode according to any of the previous clauses, wherein the spacing between adjacently arranged wells at or near the center of the active area is in a range between 1-5 μm, such as 2 μm, and wherein the spacing between adjacently arranged wells at or near the edge of the active area is in a range between 2-10 μm, such as 4 μm.

Clause 9. The MPS diode according to any of the previous clauses, wherein the drift region comprises a doped region surrounding the plurality of wells, wherein a dopant profile of the doped region is such that, for wells of each pair of adjacently arranged wells, the doped region between said wells becomes depleted at substantially a same voltage applied to the MPS diode.

Clause 10. The MPS diode according to clause 8, wherein a dopant concentration of the doped region decreases from the center of the active area to the edge of the active area, in accordance with a spacing between adjacently arranged wells.

Clause 11. The MPS diode according to clause 9 or 10, wherein a dopant concentration in the doped region is at least two times greater than a dopant concentration in a remainder of the drift region.

Clause 12. The MPS diode according to any of the clauses 9-11, wherein the doped region and the plurality of wells each extend from the surface of the semiconductor body, and wherein the doped region extends further into the semiconductor body than the plurality of wells, preferably at least 10% further, more preferably at least 20% further.

Clause 13. The MPS diode according to any of the previous clauses, wherein the semiconductor body further comprises a termination area arranged adjacent to the active area, and/or wherein the semiconductor body comprises a substrate and an epitaxial layer arranged on said substrate, wherein the active area and, if applicable, the termination area are arranged in the epitaxial layer, wherein the metal layer assembly preferably forms a first terminal of the MPS diode, and wherein the MPS diode preferably further comprises a contact arranged on the substrate, said contact forming a second terminal of the MPS diode.

Clause 14. The MPS diode according to any of the previous claims, each of the plurality of wells further comprising a subregion having a higher dopant concentration than a remainder of said well for enabling an Ohmic contact with the metal layer assembly.

Clause 15. A method for manufacturing a merged PiN Schottky, 'MPS', diode, the method comprising:

providing a semiconductor body comprising a drift region of a first conductivity type;

forming a plurality of wells of a second conductivity type different from the first conductivity type in the doped region, the plurality of wells being mutually spaced apart, each well forming a respective PN-junction with the drift region, wherein, in an outward direction from a center of the active area, a spacing between adjacently arranged wells increases; and arranging a metal layer assembly on a surface of the semiconductor body, said metal layer assembly comprising at least one metal layer, wherein said metal layer assembly forms a plurality of Schottky contacts together with the drift region and a plurality of respective Ohmic contacts with the plurality of wells.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including various modifications and/or combinations of features from different embodiments, without departing from the scope of the present disclosure as defined by the appended claims.

What is claimed is:

1. A merged PIN Schottky (MPS) diode, comprising:

a semiconductor body including an active area, wherein the active area comprises:

a drift region of a first conductivity type; and a plurality of wells of a second conductivity type different from the first conductivity type, wherein the plurality of wells are mutually spaced apart, each well forming a respective PN-junction with the drift region; and a metal layer assembly arranged on a surface of the semiconductor body and comprising at least one metal layer, wherein the metal layer assembly forms a plurality of Schottky contacts together with the drift region and a plurality of respective Ohmic contacts with the plurality of wells, and a spacing between adjacently arranged wells increases in an outward direction from a center of the active area; and wherein the drift region comprises a doped region surrounding the plurality of wells and has a dopant concentration greater than that in a remainder of the drift region, and a dopant profile of the doped region is configured so that, for wells of each pair of adjacently arranged wells, the doped region between the wells becomes depleted at substantially a same voltage applied to the MPS diode.

2. The MPS diode according to claim 1, wherein the plurality of wells are formed as strips extending in a first direction parallel to the surface of the semiconductor body, and wherein the spacing between adjacently arranged strips is constant along the first direction.

3. The MPS diode according to claim 1, wherein the spacing between adjacently arranged wells at or near an edge of the active area is at least 50% greater than the spacing between adjacently arranged wells at or near the center of the active area.

4. The MPS diode according to claim 1, wherein the spacing between adjacently arranged wells at or near the center of the active area is in a range between 1-5 μm, and wherein the spacing between adjacently arranged wells at or near the edge of the active area is in a range between 2-10 μm.

5. The MPS diode according to claim 1, wherein the dopant concentration in the doped region decreases from the center of the active area to the edge of the active area, in accordance with a spacing between adjacently arranged wells.

6. The MPS diode according to claim 1, wherein the dopant concentration in the doped region is at least two times greater than the dopant concentration in the remainder of the drift region.

7. The MPS diode according to claim 1, wherein the doped region and the plurality of wells each extend from the surface of the semiconductor body, and wherein the doped region extends further into the semiconductor body than the plurality of wells.

8. The MPS diode according to claim 1, each of the plurality of wells further comprising a subregion having a higher dopant concentration than a remainder of the well for enabling an Ohmic contact with the metal layer assembly.

9. The MPS diode according to claim 1, wherein the semiconductor body further comprises a termination area arranged adjacent to the active area.

10. The MPS diode according to claim 9, wherein the semiconductor body comprises a substrate and an epitaxial layer arranged on the substrate, wherein the active area and the termination area are arranged in the epitaxial layer, wherein the metal layer assembly forms a first terminal of the MPS diode, wherein the MPS diode further comprises a contact arranged on the substrate, and wherein the contact forms a second terminal of the MPS diode.

11. The MPS diode according to claim 1, wherein the plurality of wells are arranged as concentric shapes, and between each pair of adjacently arranged wells is a spacing that is substantially constant along a circumference thereof.

12. The MPS diode according to claim 11, wherein the spacing between adjacently arranged wells at or near an edge of the active area is at least 50% greater than the spacing between adjacently arranged wells at or near the center of the active area.

13. The MPS diode according to claim 11, wherein the spacing between adjacently arranged wells at or near the center of the active area is in a range between 1-5 μm, and wherein the spacing between adjacently arranged wells at or near the edge of the active area is in a range between 2-10 μm.

14. The MPS diode according to claim 11, wherein the dopant concentration in the doped region decreases from the center of the active area to the edge of the active area, in accordance with a spacing between adjacently arranged wells.

15. The MPS diode according to claim 1, wherein the plurality of wells are formed as strips extending parallel to the surface of the semiconductor body, and wherein the strips fan out in at least part of the active area.

16. The MPS diode according to claim 15, wherein the active area comprises an inner region in which a spacing between adjacently arranged strips is substantially constant, and a fanout region surrounding the inner region in which a spacing between adjacently arranged strips increases in the outward direction.

17. The MPS diode according to claim 16, wherein the active area further comprises an outer region surrounding the fanout region in which a spacing between adjacently arranged strips is substantially constant, and wherein the spacing between adjacently arranged strips in the outer region is greater than the spacing between adjacently arranged strips in the inner region.

18. A method for manufacturing a merged PIN Schottky (MPS) diode, the method comprising:

providing a semiconductor body comprising a drift region of a first conductivity type;

forming a plurality of wells of a second conductivity type different from the first conductivity type in the drift region, wherein the plurality of wells are mutually spaced apart, each well forming a respective PN-junction with the drift region, and a spacing between adjacently arranged wells increases in an outward direction from a center of the active area;

arranging a metal layer assembly on a surface of the semiconductor body, wherein the metal layer assembly comprises at least one metal layer, and wherein the metal layer assembly forms a plurality of Schottky contacts together with the drift region and a plurality of respective Ohmic contacts with the plurality of wells; and wherein the drift region comprises a doped region surrounding the plurality of wells and has a dopant concentration greater than that of a remainder of the drift region, and a dopant profile of the doped region is configured so that, for wells of each pair of adjacently arranged wells, the doped region between the wells becomes depleted at substantially a same voltage applied to the MPS diode.

* * * * *